(12) United States Patent
Huang et al.

(10) Patent No.: US 10,290,604 B2
(45) Date of Patent: May 14, 2019

(54) SUBSTRATELESS INTEGRATED CIRCUIT PACKAGES AND METHODS OF FORMING SAME

(71) Applicant: Taiwan Semiconductor Manufacturing Company, Ltd., Hsinshu (TW)

(72) Inventors: Lin-Chih Huang, Hsinchu (TW); Hung-An Teng, Taoyuan (TW); Hsin-Yu Chen, Taipei (TW); Tsang-Jiuh Wu, Hsinchu (TW); Cheng-Chieh Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/837,704

(22) Filed: Dec. 11, 2017

(65) Prior Publication Data

US 2018/0114770 A1 Apr. 26, 2018

Related U.S. Application Data

(62) Division of application No. 14/479,044, filed on Sep. 5, 2014, now Pat. No. 9,842,825.

(51) Int. Cl.
*H01L 21/00* (2006.01)
*H01L 23/00* (2006.01)
(Continued)

(52) U.S. Cl.
CPC .......... *H01L 24/81* (2013.01); *H01L 21/6835* (2013.01); *H01L 21/78* (2013.01); *H01L 23/49816* (2013.01); *H01L 23/49822* (2013.01); *H01L 23/49827* (2013.01); *H01L 23/5389* (2013.01); *H01L 24/03* (2013.01); (Continued)

(58) Field of Classification Search
CPC . H01L 2224/11334; H01L 2224/05684; H01L 2224/05655; H01L 2224/05647; H01L 2224/05644; H01L 2224/05639; H01L 2224/05082; H01L 2224/05026; (Continued)

(56) References Cited

U.S. PATENT DOCUMENTS 8,097,490 B1 1/2012 Pagaila et al.
8,148,257 B1 4/2012 Barth et al.
(Continued)

FOREIGN PATENT DOCUMENTS

JP 2013140971 A 7/2013
KR 20070057038 A 6/2007
(Continued)

*Primary Examiner* — Anthony Ho
*Assistant Examiner* — Mohammad M Hoque
(74) *Attorney, Agent, or Firm* — Slater Matsil, LLP

(57) ABSTRACT

Integrated circuit packages and methods of forming the same are provided. One or more redistribution layers are formed on a carrier. First connectors are formed on a first side of the RDLs. Dies are bonded to the first side of the RDLs using the first connectors. An encapsulant is formed on the first side of the RDLs around the dies. The carrier is de-bonded from the overlaying structure and second connectors are formed on a second side of the RDLs. The resulting structure in diced to form individual packages.

20 Claims, 7 Drawing Sheets

(51) Int. Cl.
*H01L 21/78* (2006.01)
*H01L 23/538* (2006.01)
*H01L 23/498* (2006.01)
*H01L 21/683* (2006.01)
*H01L 25/065* (2006.01)
*H01L 25/00* (2006.01)
*H01L 23/14* (2006.01)
*H01L 21/56* (2006.01)
*H01L 23/31* (2006.01)

(52) U.S. Cl.
CPC ............ *H01L 24/17* (2013.01); *H01L 24/96* (2013.01); *H01L 25/0655* (2013.01); *H01L 25/50* (2013.01); *H01L 21/561* (2013.01); *H01L 21/568* (2013.01); *H01L 23/145* (2013.01); *H01L 23/3114* (2013.01); *H01L 24/05* (2013.01); *H01L 24/11* (2013.01); *H01L 24/13* (2013.01); *H01L 2221/68345* (2013.01); *H01L 2221/68359* (2013.01); *H01L 2224/03* (2013.01); *H01L 2224/0401* (2013.01); *H01L 2224/04105* (2013.01); *H01L 2224/05026* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05639* (2013.01); *H01L 2224/05644* (2013.01); *H01L 2224/05647* (2013.01); *H01L 2224/05655* (2013.01); *H01L 2224/05684* (2013.01); *H01L 2224/11* (2013.01); *H01L 2224/1146* (2013.01); *H01L 2224/11334* (2013.01); *H01L 2224/11849* (2013.01); *H01L 2224/12105* (2013.01); *H01L 2224/13111* (2013.01); *H01L 2224/16235* (2013.01); *H01L 2224/16238* (2013.01); *H01L 2224/81001* (2013.01); *H01L 2224/81005* (2013.01); *H01L 2224/81192* (2013.01); *H01L 2224/92124* (2013.01); *H01L 2224/96* (2013.01); *H01L 2224/97* (2013.01); *H01L 2924/00011* (2013.01); *H01L 2924/01029* (2013.01); *H01L 2924/01047* (2013.01); *H01L 2924/01322* (2013.01); *H01L 2924/15311* (2013.01); *H01L 2924/18161* (2013.01); *H01L 2924/18162* (2013.01)

(58) Field of Classification Search
CPC . H01L 2924/00011; H01L 2924/01322; H01L 2224/16238
USPC .......................................................... 257/738
See application file for complete search history.

(56) References Cited

U.S. PATENT DOCUMENTS

| | | | |
|---|---|---|---|
| 8,237,274 | B1 | 8/2012 | Rahman |
| 8,963,334 | B2 | 2/2015 | Lin et al. |
| 2004/0131878 | A1 | 7/2004 | Seet et al. |
| 2004/0140219 | A1 | 7/2004 | Bojkov et al. |
| 2006/0046350 | A1 | 3/2006 | Jiang et al. |
| 2007/0122940 | A1 | 5/2007 | Gautham |
| 2007/0124924 | A1 | 6/2007 | Nakamura |
| 2008/0299757 | A1* | 12/2008 | Wen ............ H01L 24/11 438/614 |
| 2009/0014843 | A1* | 1/2009 | Kawashita ...... H01L 21/6835 257/621 |
| 2009/0140381 | A1* | 6/2009 | Lin ............... H01L 21/76898 257/528 |
| 2010/0200279 | A1* | 8/2010 | Kariya ............ H01L 21/486 174/255 |
| 2011/0111560 | A1 | 5/2011 | Purushothaman et al. |
| 2011/0278736 | A1 | 11/2011 | Lin et al. |
| 2012/0074574 | A1 | 3/2012 | Barth et al. |
| 2012/0153498 | A1* | 6/2012 | Kang ............. H01L 23/3114 257/774 |
| 2013/0168841 | A1 | 7/2013 | Zhao et al. |
| 2013/0171749 | A1 | 7/2013 | Guu et al. |
| 2013/0200524 | A1* | 8/2013 | Han ............... H01L 23/3107 257/774 |
| 2013/0221519 | A1 | 8/2013 | Hwang et al. |
| 2014/0264235 | A1 | 9/2014 | Gong et al. |
| 2014/0273354 | A1 | 9/2014 | Ramaswami et al. |
| 2014/0339699 | A1* | 11/2014 | Arvin ............. H01L 23/49816 257/738 |
| 2014/0374900 | A1* | 12/2014 | Kwon ............. H01L 23/36 257/737 |
| 2015/0235988 | A1 | 8/2015 | Ray et al. |
| 2015/0371938 | A1* | 12/2015 | Katkar ............ H01L 25/50 257/774 |
| 2015/0380370 | A1 | 12/2015 | Kraus et al. |

FOREIGN PATENT DOCUMENTS

| | | |
|---|---|---|
| KR | 20070059996 A | 6/2007 |
| KR | 20130096990 A | 9/2013 |
| TW | 201310586 A | 3/2013 |

\* cited by examiner

SUBSTRATELESS INTEGRATED CIRCUIT PACKAGES AND METHODS OF FORMING SAME

PRIORITY CLAIM AND CROSS-REFERENCE

This application is a divisional of U.S. application Ser. No. 14/479,044, entitled "Substrateless Integrated Circuit Packages and Methods of Forming Same," filed on Sep. 5, 2014, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, wafers/dies are stacked on top of one another and are interconnected using through connections such as through vias (TVs). Some of the benefits of 3DICs, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
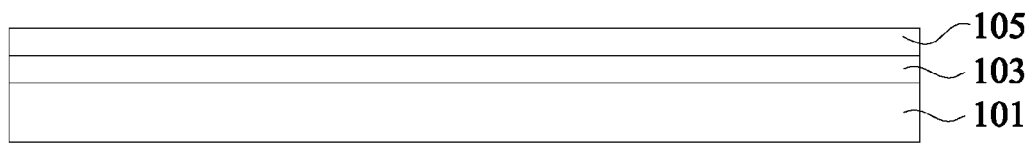
FIGS. 1-9 are cross-sectional views of various processing steps during fabrication of integrated circuit packages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit packages and the methods of forming the same are provided in accordance with various embodiments. In particular, the intermediate stages of forming the integrated circuit packages are illustrated. Throughout the various views and illustrative embodiments, like reference numbers are used to designate like elements.

FIGS. 1 through 9 illustrate cross-sectional views of intermediate stages in the manufacturing of packages in accordance with some embodiments. Referring first to FIG. 1, there is shown a portion of a carrier 101 with a release layer 103 formed on the carrier 101. The carrier 101 may be formed of quartz, glass, a ceramic material, or the like, and provides mechanical support for subsequent operations. The carrier 101 may have a round plan-view shape and may be a size of a silicon wafer. For example, the carrier 101 may have an 8-inch diameter, a 12-inch diameter, or the like. The release layer 103 may be formed of a polymer-based material, which may be removed along with the carrier 101 from the overlying structures that will be formed in subsequent steps. In some embodiments, the release layer 103 may comprise a light-to-heat conversion (LTHC) material, a ultra-violet (UV) adhesive (which loses its adhesive property when exposed to UV radiation), an epoxy-based thermal-release material (which loses its adhesive property when exposed to a heat source), or the like. The release layer 103 may be formed using a deposition process, a spin-on coating, a printing process, a lamination process, or the like. The release layer 103 may be subsequently cured. In some embodiments, the top surface of the release layer 103 is leveled and has a high degree of co-planarity, which may be advantageous for forming subsequent layers.

Referring further to FIG. 1, a seed layer 105 is blanket formed on the release layer 103. In some embodiments, the seed layer 105 may comprise one or more layers of copper, titanium, nickel, gold, manganese, the like, or a combination thereof, and may be formed by atomic layer deposition (ALD), physical vapor deposition (PVD), sputtering, the like, or a combination thereof.

Figure 2:
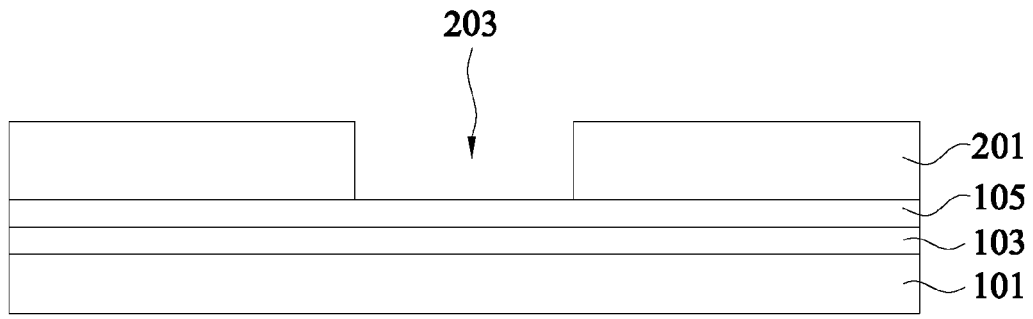

Referring to FIG. 2, a first dielectric layer 201 is formed on the seed layer 105. The bottom surface of the first dielectric layer 201 may be in contact with the top surface of the seed layer 105. In some embodiments, the first dielectric layer 201 is formed of a polymer, which may be a photo-sensitive material such as polybenzoxazole (PBO), polyimide, benzocyclobutene (BCB), or the like, that may be easily patterned using a lithography mask. In alternative embodiments, the first dielectric layer 201 may comprise a non-photo-patternable dielectric material such as silicon nitride, silicon carbide, silicon oxide, silicon oxynitride, PhosphoSilicate Glass (PSG), BoroSilicate Glass (BSG), Boron-doped PhosphoSilicate Glass (BPSG), the like, or a combination thereof. The first dielectric layer 201 may be deposited by chemical vapor deposition (CVD), PVD, ALD, a spin-on coating process, the like, or a combination thereof.

Referring further to FIG. 2, the first dielectric layer 201 is patterned to form openings such as a first opening 203 in the first dielectric layer 201. Hence, the seed layer 105 is exposed through the first opening 203 in the first dielectric layer 201. In an embodiment with the first dielectric layer 201 formed of a photo-patternable material, the first opening 203 may be formed using a suitable photolithography technique to expose the first dielectric layer 201 to light. In such an embodiment, the first dielectric layer 201 is developed and/or cured after the exposure.

Figure 3:
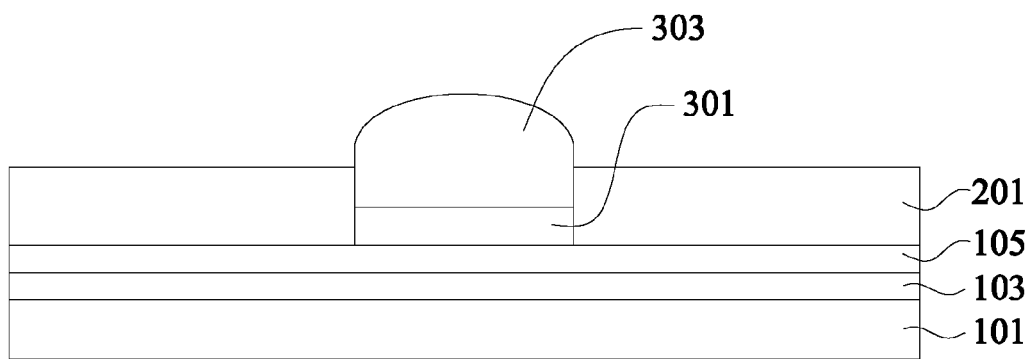
Figure 4:
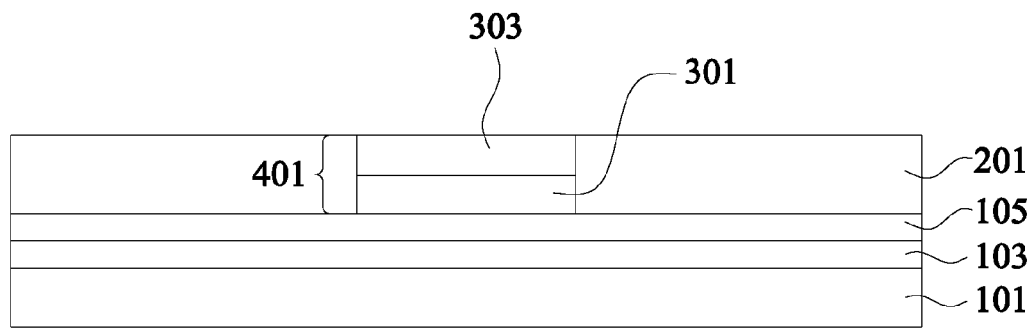

FIGS. 3 and 4 illustrate formation of under-bump metallurgies (UBMs) in the first openings of the first dielectric layer 201, such as a UBM 401 (see FIG. 4) in the first opening 203 (see FIG. 2). In some embodiments, a first conductive material 301 and a second conductive material 303 are formed in the first opening 203, wherein the second conductive material 303 overfills the first opening 203. The first conductive material 301 and the second conductive material 303 may comprise copper, tungsten, aluminum, nickel, silver, gold, the like, or a combination thereof, and may be formed using an electro-chemical plating process, an electroless plating process, ALD, PVD, the like, or a combination thereof. In some embodiments, the seed layer 105 is used as a seed layer for a plating process. In some embodiments, the first conductive material 301 is nickel and the second conductive material 303 is copper.

Referring to FIG. 4, portions of the second conductive material 303 overfilling the first opening 203 (see FIG. 2) are removed such that the top surface of the second conductive material 303 is substantially co-planar with the top surface of the first dielectric layer 201. The portions of the second conductive material 303 overfilling the first opening 203 may be removed using an etch process, a planarization process (e.g., a chemical mechanical polishing (CMP) process), or the like.

Figure 5:
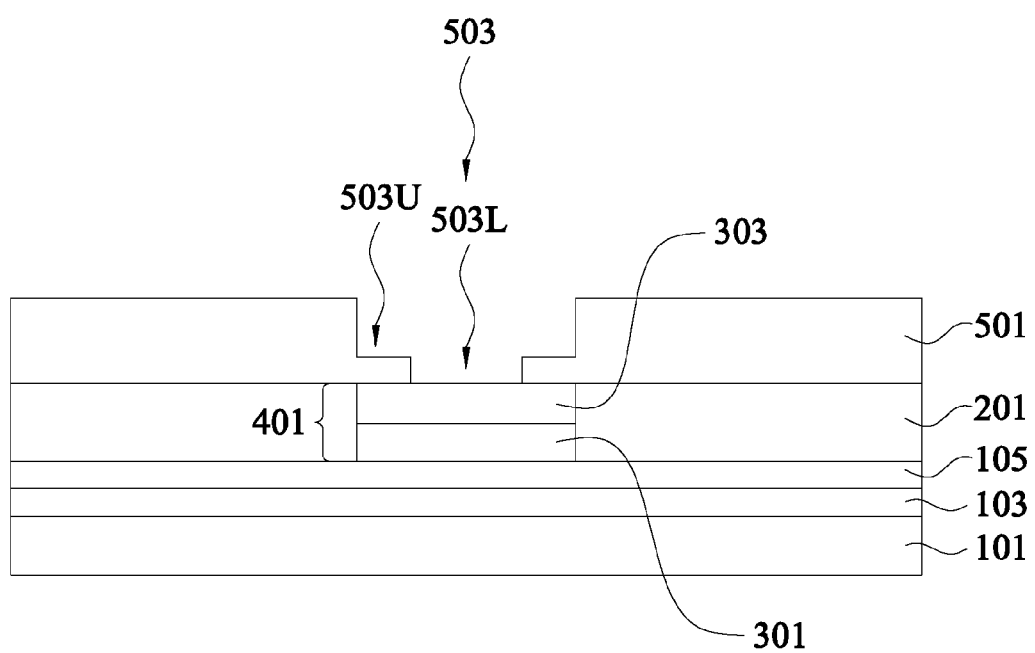
Figure 6:
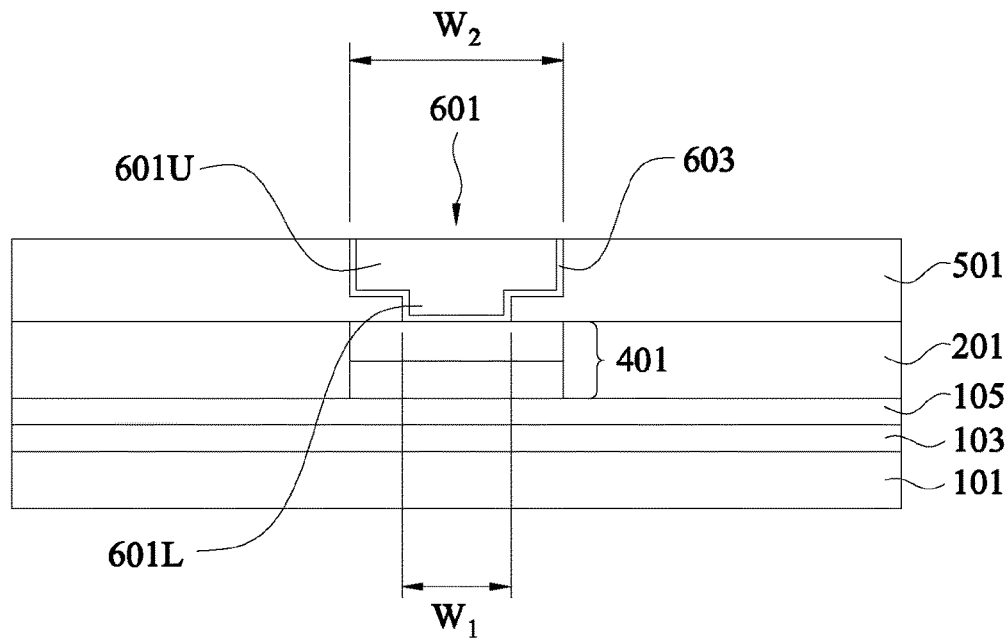
Figure 7:
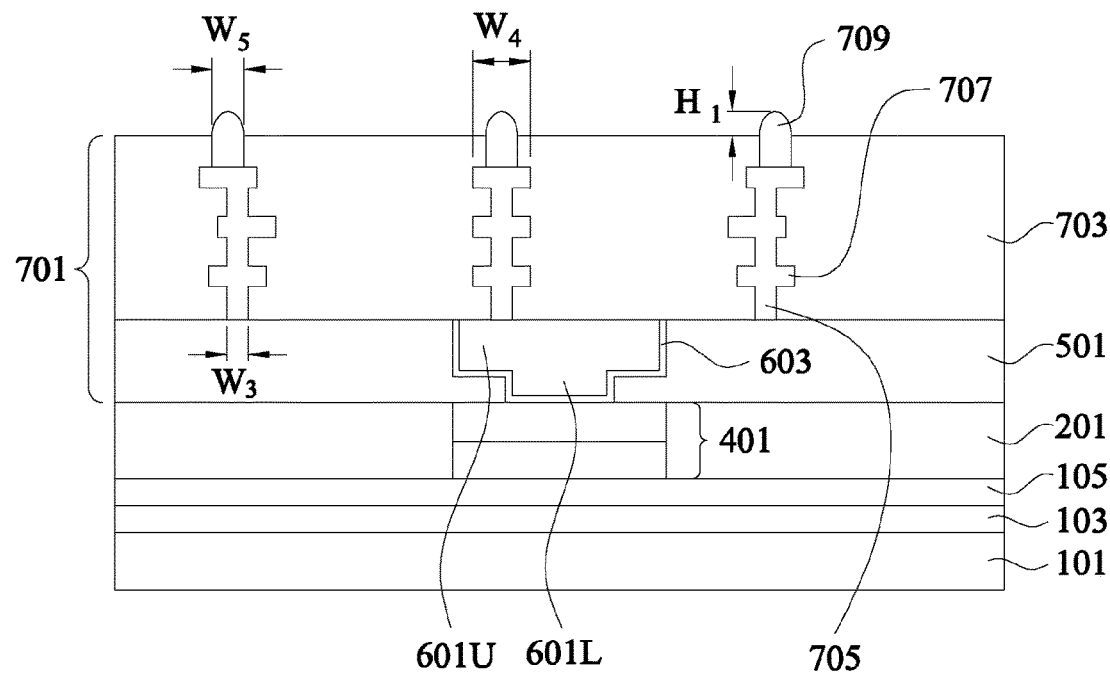

Referring to FIGS. 5-7, one or more redistribution layers (RDLs) 701 are formed on the first dielectric layer 201 and the UBM 401. In some embodiments, the RDLs 701 comprise one or more dielectric layers and one or more conductive features disposed within the one or more dielectric layers. In some embodiments, the one or more conductive features are formed in the one or more dielectric layers using a dual damascene process. In alternative embodiments, the one or more conductive features may be formed using other suitable methods. As described below in greater detail, the RDLs 701 provide an electrical interface between subsequently bonded integrated circuit dies, as well as an electrical interface between integrated circuit dies and external devices.

Turning first to FIG. 5, a bottommost dielectric layer 501 of the RDLs 701 is formed on the first dielectric layer 201 and the UBM 401. The material for the bottommost dielectric layer 501 may be selected from the same candidate materials as for the first dielectric layer 201. The bottommost dielectric layer 501 is patterned to form second openings such as a second opening 503 in the bottommost dielectric layer 501. In an embodiment with the bottommost dielectric layer 501 formed of a photo-patternable material, the second opening 503 may be formed using a suitable photolithography technique to expose the bottommost dielectric layer 501 to light. In such an embodiment, the bottommost dielectric layer 501 is developed and/or cured after the exposure. The second opening 503 exposes the UBM 401 as illustrated in FIG. 5. In the illustrated embodiment, the second opening 503 comprises a first portion 503L, which may be also referred as a via hole 503L, and a second portion 503U, which may be also referred as a trench 503U.

Referring to FIG. 6, conductive features are formed in the second openings in the bottommost dielectric layer 501, such as a conductive feature 601 in the second opening 503 (see FIG. 5). In some embodiments, a barrier/seed layer 603 is blanket formed over the bottommost dielectric layer 501 and lining the second opening 503. The barrier/seed layer 603 may comprise one or more layers of copper, nickel, gold, manganese, titanium, titanium nitride, tantalum, tantalum nitride, the like, or a combination thereof, and may be formed by ALD, PVD, sputtering, the like, or a combination thereof. Subsequently, the second opening 503 is filled with a conductive material such as copper, tungsten, aluminum, nickel, silver, gold, the like, or a combination thereof, using an electro-chemical plating process, an electroless plating process, ALD, PVD, the like, or a combination thereof to form the conductive feature 601. In some embodiments, the conductive materials of the conductive feature 601 and the barrier/seed layer 603 may overfill the second opening 503. Portions of the conductive materials overfilling the second opening 503 may be removed using an etch process, a planarization process (e.g., a CMP process), or the like.

Referring further to FIG. 6, the conductive feature 601 comprises a first portion 601L, which may also be referred as a conductive via 601L, and a second portion 601U, which may also be referred as a conductive line/trace 601U. In some embodiments, the conductive via 601L has a first width $W_1$ between about 10 μm and about 20 μm, and the conductive line/trace 601U has a second width $W_2$ between about 20 μm and about 100 μm.

Referring to FIG. 7, upper dielectric layers 703, conductive vias 705 and conductive lines/traces 707 are formed over the bottommost dielectric layer 501, which completes the formation of the RDLs 701. In some embodiments, materials for the upper dielectric layers 703 may be selected from the same candidate materials as for the first dielectric layer 201 and the bottommost dielectric layer 501. The conductive lines/traces 707 and the conductive vias 705 may be formed in the corresponding upper dielectric layers 703 using a method similar to that described above with reference to the conductive feature 601 (see FIGS. 5 and 6) and the description is not repeated herein. Moreover, the conductive lines/traces 707 and the conductive vias 705 further comprise barrier/seed layers (not shown) similar to the barrier/seed layer 603. In some embodiments, the conductive vias 705 have a third width $W_3$ between about 0.2 μm and about 2 μm, and the conductive lines/traces 707 have a fourth width $W_4$ between about 10 μm and about 30 μm.

Referring further to FIG. 7, first connectors 709 are formed on the top side of the RDLs 701. In some embodiment, a topmost dielectric layer (not individually shown) of the upper dielectric layers 703 is patterned to form openings and expose conductive feature such as the conductive lines/traces 707 located below the topmost dielectric layer of the upper dielectric layers 703. Subsequently, the openings in the topmost dielectric layer are filled by a metallic material, a solder material, or the like to form the first connectors 709. In some embodiments, the first connectors 709 are formed of a low-temperature reflow material. A low temperature reflow material is a material that is reflowable to form an electrical connection between two substrates at a temperature lower than a reflow temperature of other materials used to form the connected substrates and is reflowable at a temperature within a thermal budget of the connected substrates. As an example of a low temperature reflow material, some embodiments may utilize a SnPb solder that has a reflow temperature of about 150 degrees C. As another example of a low temperature reflow material, some embodiments may utilize a lead-free solder that has a reflow temperature of about 200 degrees C. These examples generally have a lower reflow temperature of, for example, copper or aluminum lines and will likely be within the thermal budget of the connected substrates. Other low temperature reflow materials may be used. In some embodiments, the first connectors 709 may be micro-bumps, or the like. As illustrated in FIG. 7, the first connectors 709 extend above the topmost surface of the RDLs 701. In some embodiments, the first connectors 709 have a fifth width $W_5$ between about 10 µm and about 30 µm, and portions of the first connectors 709 extending above the topmost surface of the RDLs 701 have a first height $H_1$ between about 5 µm and about 60 µm.

As illustrated in FIG. 7, three first connectors 709 are formed on the top side of the RDLs 701. However, one skilled in the art will recognize that the particular number of the first connectors 709 is provided for illustrative purpose only and is not limiting the scope of the present disclosure. In other embodiments, the number of the first connectors 709 may vary depending on design requirements.

Figure 8:
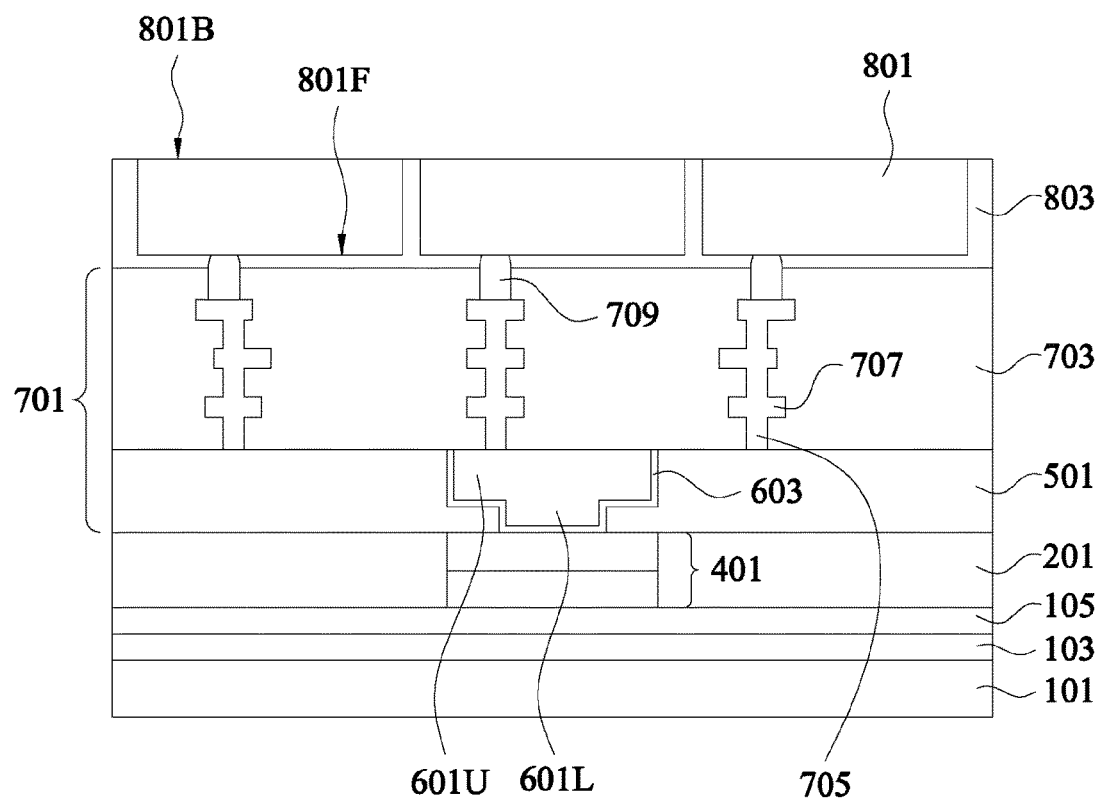

Next, referring to FIG. 8, dies 801 are bonded to the RDLs 701 using the first connectors 709. In some embodiments, the dies 801 may be logic dies, memory dies, sensor dies, analog dies, or the like. The dies 801 may be formed using a complementary metal-oxide-semiconductor (CMOS) process, a micro-electro-mechanical systems (MEMS) process, a nano-electro-mechanical systems (NEMS) process, the like, or a combination thereof. In some embodiments, the dies 801 may be formed as part of a wafer. The wafer is then singulated by sawing, laser ablation, or the like, to form individual dies 801. Subsequently, functional testing may be performed on the dies 801. Thus, the dies 801 in FIG. 8 may include only known good dies (KGDs), which have passed one or more functional quality tests.

The dies 801 may comprise a substrate, various active and passive devices on the substrate, and various metallization layers over the substrate, which are not explicitly illustrated in FIG. 8 as their inclusion is not necessary for understanding various embodiments described herein. The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The metallization layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, CVD, and plasma enhanced chemical vapor deposition (PECVD).

In some embodiments, interconnect structures may be formed in the ILD/IMDs using, for example, a damascene process, a dual damascene process, or the like. The ILD/IMDs may be patterned using photolithography techniques to form trenches and vias. The interconnect structures are formed by depositing a suitable conductive material in the trenches and the vias of the ILD/IMDs using various deposition and plating methods, or the like. In addition, the interconnect structures may include one or more barrier/adhesion layers (not shown) to protect the ILD/IMDs from diffusion and metallic poisoning. The one or more barrier/adhesion layers may comprise titanium, titanium nitride, tantalum, tantalum nitride, or other alternatives. The barrier layer may be formed using PVD, ALD, sputtering, or the like. The conductive material of the interconnect structures may comprise copper, a copper alloy, silver, gold, tungsten, tantalum, aluminum, and the like. In an embodiment, the steps for forming the interconnect structures may include blanket forming the one or more barrier/adhesion layers, depositing a thin seed layer of a conductive material, and filling the trenches and the vias in the ILD/IMDs with the conductive material, for example, by plating. A CMP is then performed to remove excess portions of the interconnect structures. In some embodiments, the interconnect structures may provide electrical connections between the various passive and active devices formed on the substrate.

Referring further to FIG. 8, a contact layer including one or more contact pads (not shown) are formed over the metallization layers on front sides 801F of the dies 801 and may be electrically coupled to the active devices through various interconnect structures of the metallization layers. In some embodiments, the contact pads may comprise aluminum, although other conductive materials such as copper, tungsten, silver, gold, the like, or a combination thereof may also be used.

The dies 801 are bonded to the RDLs such that front sides 801F of the dies 801 contact the first connectors 709 as illustrated in FIG. 8. In some embodiments, the contact pads on the front sides 801F of the dies 801 are exposed and the first connectors 709 are bonded to corresponding contact pads, such that the first connectors 709 provide electrical connection between the dies 801 and the RDLs 701.

Referring further to FIG. 8, an encapsulant 803 is formed over the RDLs 701 and between neighboring dies 801. The encapsulant 803 may also fill the voids between the dies 801 and the RDLs 701. In some embodiments, the encapsulant 803 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the dies 801.

In some embodiments, portions of the encapsulant 803 extending over top surfaces of the dies 801 may be removed to expose back sides 801B of the dies 801. The portions of the encapsulant 803 may be removed using a CMP, a grinding process, an etch process, or another suitable thinning process. In some embodiments, the thinning process is performed until the top surface of the encapsulant 803 is substantially coplanar with the back sides 801B of the dies 801 as illustrated in FIG. 8.

Figure 9:
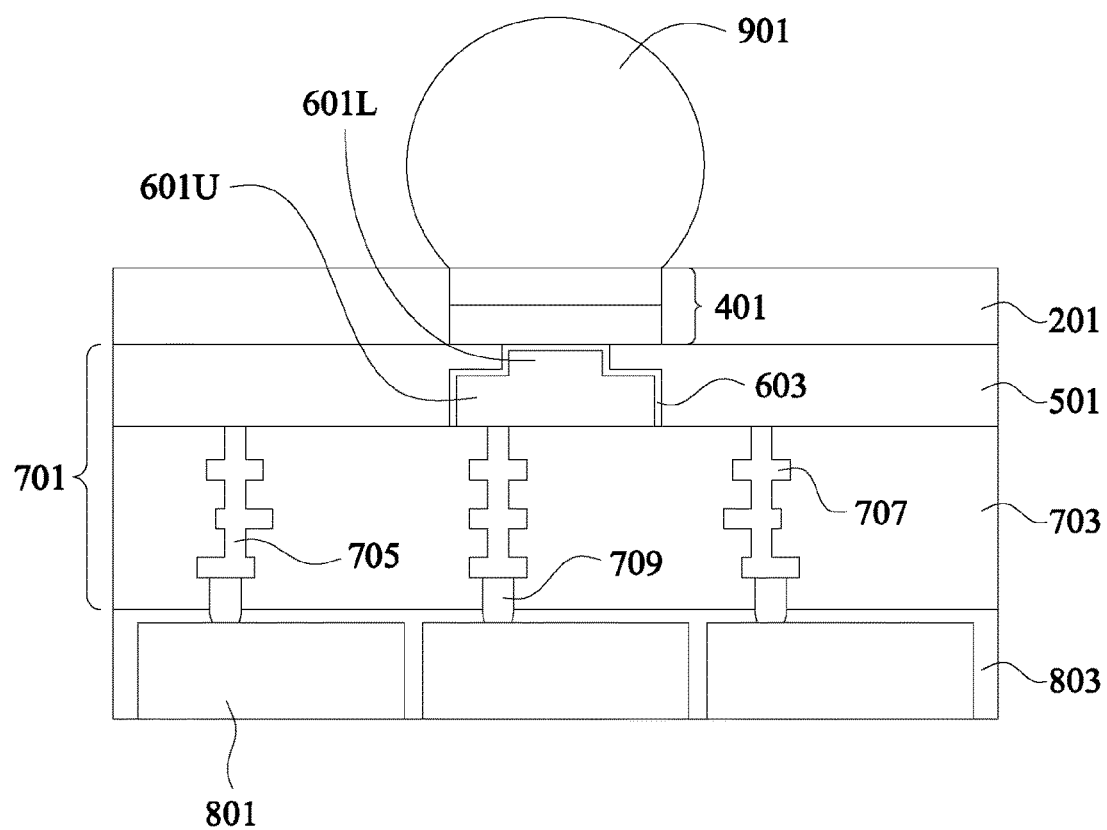

Referring to FIG. 9, a carrier de-bonding process is performed to detach (de-bond) the carrier 101 from the overlying structure. In some embodiments, the de-bonding includes projecting a light such as a laser light or a UV light on the release layer 103 so that the release layer 103 decomposes under the heat of the light and the carrier 101 can be safely removed. The seed layer 105 may be also removed, for example, using a grinding process, a CMP process, an etch process, or the like. In an embodiment with the seed layer 105 formed of copper, the seed layer 105 is removed by etching with a mixture of $FeCl_3$, HCl, and $H_2O$.

Referring further to FIG. 9, second connectors such as a second connector 901 are formed to connect to UBMs such as the UBM 401. The second connector 901 may be a ball grid array (BGA) ball and may comprise solder materials such as lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu). In some embodiments, forming the second connector 901 such a BGA ball includes placing a solder ball on the UBM 401 and then performing a reflow process. In alternative embodiments, forming the second connector 901 such a BGA ball includes plating solder on the UBM 401 and then reflowing the plated solder.

As illustrated in FIG. 9, sizes of the first connectors 709 are smaller than sizes of the second connectors 901. FIG. 9 further illustrates one first connector 709 on each die 801 for illustrative purposes. In other embodiments, each die 801 may have many first connectors 709 having a first pitch (not shown). In some embodiments, the first pitch of the first connectors 709 is smaller than a second pitch of the second connectors 901. Accordingly, the conductive features of the RDLs have various sizes and pitches to provide electrical connection between the first connectors 709 and the second connectors 901. In the illustrated embodiment, the conductive vias 601L and the conductive lines/traces 601U of the RDLs 701 are in electrical contact with the second connectors 901 (through the UBMs 401) and have larger sizes and pitches than the conductive vias 705 and the conductive lines/traces 707, which are in electrical contact with the first connectors 709.

After forming the second connectors such as the second connector 901, the structure illustrated in FIG. 9 is diced, for example, by sawing, laser ablation, or the like. The singulation results in the formation of a plurality of packages, which may be identical in some embodiments. Subsequently, each of the packages is tested to identify known good packages (KGPs) for further processing.

Figure 10:
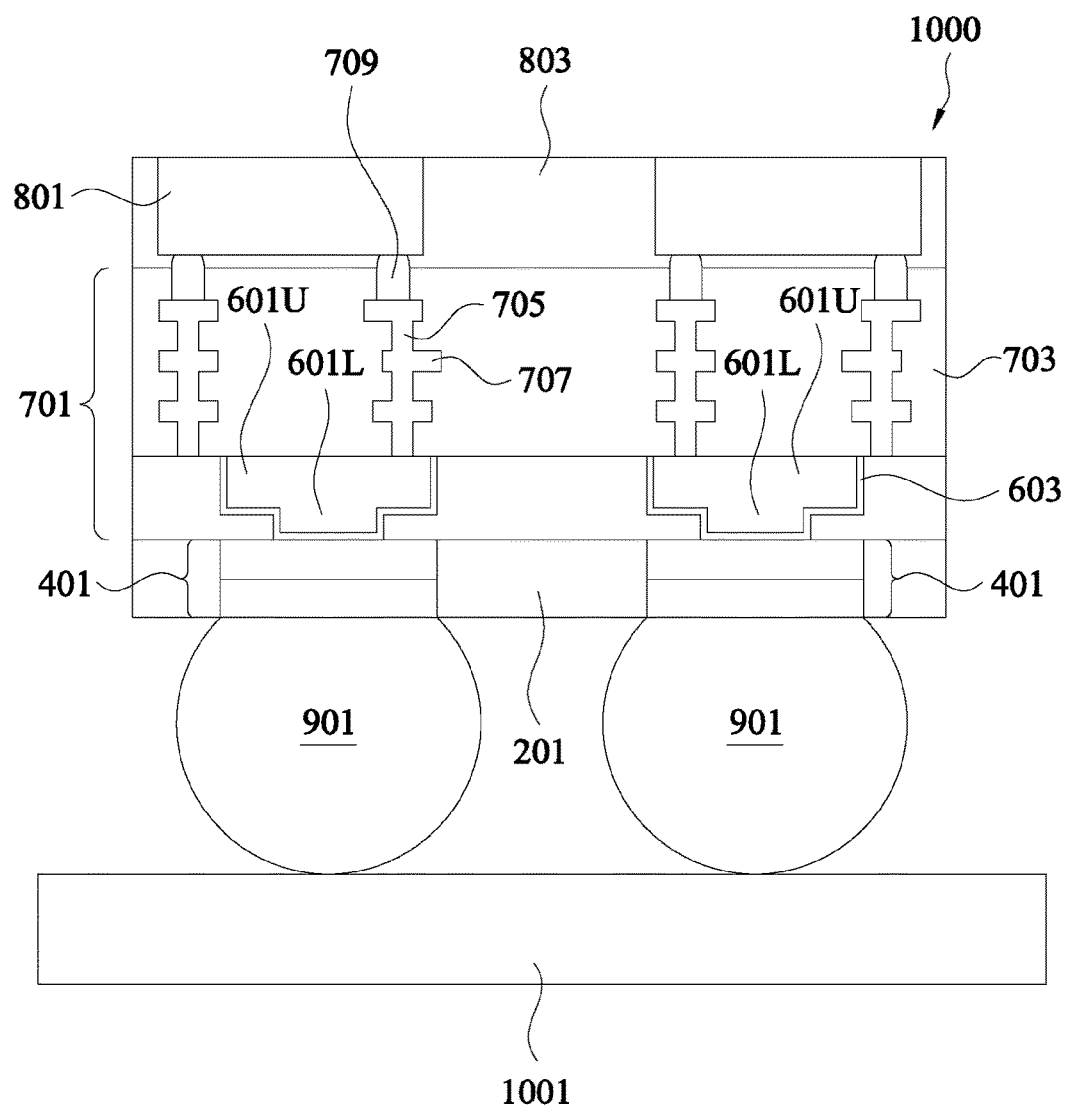
FIG. 10 is a cross-sectional view of an integrated circuit package mounted on a substrate in accordance with some embodiments.

FIG. 10 illustrates an exemplary KGP 1000 formed using the method described above with reference to FIGS. 1-9 and bonded to a substrate 1001, such as a printed circuit board (PCB), another package, a die, a wafer, or the like. In the illustrated embodiment, the KGP 1000 comprises two dies (such as dies 801) and two connectors (such the second connectors 901). One skilled in the art will recognize that the number of dies and the number of connectors are provided for illustrative purpose only and are not limiting the scope of the present disclosure. In other embodiments, the KGP 1000 may comprise appropriate number of dies and connectors depending on design requirements for the KGP 1000.

Referring further to FIG. 10, the KGP 1000 is bonded to the substrate 1001 using the second connectors 901. In an embodiment with the second connectors 901 being the BGA balls, a solder reflow process is performed to attach the KGP 1000 to the substrate 1001. In the illustrated embodiment, the second connectors 901, the RDLs 701, and the first connectors 709 provide electrical connection between the dies 801 and the substrate 1001. In turn, the substrate 1001 provides the electrical connection between the KGP 1000 and other functional systems placed on the substrate 1001. In the illustrated embodiment, the KGP 1000 does not comprise a package substrate and the RDLs 701 provide a direct electrical interface between the dies 801 and the substrate 1001. Therefore, the KGP 1000 may be also referred as a substrate-less package.

Figure 11:
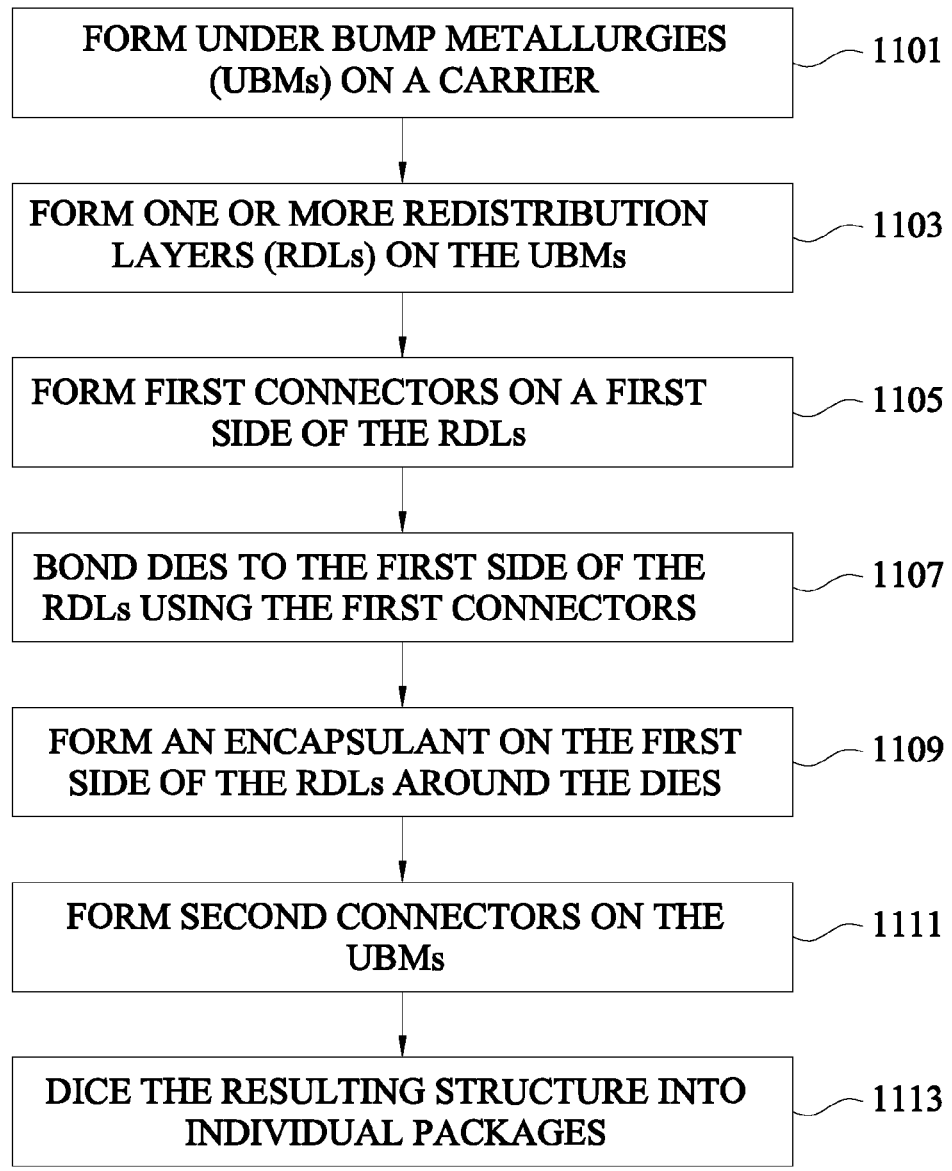
FIG. 11 is a flow diagram illustrating a method of forming integrated circuit packages in accordance with some embodiments.

FIG. 11 is a flow diagram illustrating a method of forming integrated circuit packages in accordance with some embodiments. The method starts with step 1101, wherein under-bump metallurgies (such as the UBMs 401) are formed on a carrier (such as the carrier 101) as described above with reference to FIGS. 1-4. Next, in step 1103, one or more redistribution layers (such as the RDLs 701) are formed on the UBMs as described above with reference to FIGS. 5-7. In step 1105, first connectors (such as the first connectors 709) are formed on a first side of the RDLs as described above with reference to FIG. 7. Subsequently, in step 1107, dies (such as the dies 801) are bonded to the first side of the RDLs using the first connectors. In step 1109, an encapsulant (such as the encapsulant 803) is formed on the first side of the RDLs around the dies as described above with reference to FIG. 8. In step 1111, the carrier is de-bonded from the overlaying structure and second connectors (such as the second connectors 901) are formed on the UBMs as described above with reference to FIG. 9. Finally, in step 1113, the resulting structure in diced to form individual packages (such as the KGP 1000) as described above with reference to FIGS. 9 and 10.

Advantageous features of the embodiments of the present disclosure may include, but are not limited to, a more efficient manufacturing process and cost reduction. In particular, by eliminating package substrates from packages the process steps associated with package substrates (e.g., through substrate via (TSV) formation) are eliminated, which in turn may speed up packaging process and provide cost saving. Moreover, by eliminating the package substrates ultra-thin packages may be manufactured.

In an embodiment, a device includes: an interconnect including: a first dielectric layer; a first conductive feature extending from a first side of the first dielectric layer to a second side of the first dielectric layer, the first conductive feature having a first width at the first side of the first dielectric layer and a second width at the second side of the first dielectric layer, the first width being greater than the second width; a plurality of second dielectric layers on the first side of the first dielectric layer; and a plurality of second conductive features in the second dielectric layers; a third dielectric layer on the second side of the first dielectric layer; and an under-bump metallurgy (UBM) extending through the third dielectric layer to couple with the first conductive feature.

In some embodiments, the device further includes: first connectors coupled to the second conductive features of the interconnect. In some embodiments, the device further includes: a die attached to the first connectors; and an encapsulant on the second dielectric layers of the interconnect, the encapsulant surrounding the die and the first connectors. In some embodiments, the device further includes: second connectors coupled to the UBM, the second connectors being larger than the first connectors. In some embodiments, the device further includes: a package substrate connected to the second connectors. In some embodiments, a pitch of the first connectors is smaller than a pitch of the second connectors. In some embodiments, the first conductive feature includes: a conductive material; and a seed layer extending along sides of the conductive material and disposed between the conductive material and the UBM. In some embodiments, the UBM includes: a first conductive material; and a second conductive material disposed between the first conductive material and the first conductive feature, the second conductive material different from the first conductive material. In some embodiments, the first conductive material is nickel and the second conductive material is copper.

In an embodiment, a device includes: a first dielectric layer; an under-bump metallurgy (UBM) extending through the first dielectric layer; a second dielectric layer on the first dielectric layer, the second dielectric layer having a first side facing the UBM and a second side opposite the first side; a seed layer extending through the second dielectric layer; a conductive material on the seed layer, the conductive material separated from the second dielectric layer by the seed layer, the conductive material separated from the UBM by the seed layer, the conductive material having a first width at the first side of the second dielectric layer and a second width at the second side of the second dielectric layer, the second width being greater than the first width.

In some embodiments, top surfaces of the conductive material and the second dielectric layer are level. In some embodiments, bottom surfaces of the seed layer and the second dielectric layer are level. In some embodiments, the device further includes: a plurality of third dielectric layers on the second side of the second dielectric layer; and a plurality of conductive features disposed in the third dielectric layers. In some embodiments, the device further includes: a die attached to the third dielectric layers; and an encapsulant surrounding the die, top surfaces of the die and the encapsulant being level.

In an embodiment, a device includes: one or more redistribution layers (RDLs), the one or more RDLs having a first side and a second side opposite the first side; first connectors on the first side of the one or more RDLs, where the first connectors are formed of a first low temperature reflow material; a first dielectric layer on the second side of the one or more RDLs; a conductive feature extending from a first side of the first dielectric layer to a second side of the first dielectric layer, the conductive feature having a first width at the first side of the first dielectric layer and a second width at the second side of the first dielectric layer, the second width different from the first width; a second dielectric layer on the first dielectric layer; an under-bump metallurgy (UBM) extending through the second dielectric layer to contact the conductive feature; second connectors on the UBM, where the second connectors are larger than the first connectors, and where the second connectors are formed of a second low temperature reflow material; a die attached to the first connectors; and an encapsulant on the first side of the one or more RDLs, where the encapsulant extends along sidewalls of the die, and at least a portion of the encapsulant extends between the die and the one or more RDLs.

In some embodiments, a topmost surface of the encapsulant is substantially coplanar with a back side of the die. In some embodiments, the device further includes under-bump metallurgies (UBMs), the UBMs being interposed between the second connectors and the one or more RDLs. In some embodiments, a pitch of the first connectors is smaller than a pitch of the second connectors. In some embodiments, the first connectors are micro-bumps. In some embodiments, the second connectors are ball grid array (BGA) connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an interconnect comprising:
   a first dielectric layer;
   a first conductive feature extending from a first side of the first dielectric layer to a second side of the first dielectric layer, the second side being opposite the first side, the first conductive feature having a first width at the first side of the first dielectric layer and a second width at the second side of the first dielectric layer, the first width being greater than the second width, the first conductive feature comprising a main conductive material and a seed layer extending along sides and a bottom of the main conductive material;
   a plurality of second dielectric layers on the first side of the first dielectric layer; and
   a plurality of second conductive features in the second dielectric layers;
   a third dielectric layer on the second side of the first dielectric layer; and
   an under-bump metallurgy (UBM) extending through the third dielectric layer to couple with the first conductive feature, top surfaces of the UBM and the third dielectric layer being level, the UBM comprising a first conductive layer and a second conductive layer, bottom surfaces of the UBM and the third dielectric layer being level, the first conductive layer and the second conductive layer having a same third width, the seed layer being disposed between and contacting the main conductive material and the UBM.

2. The device of claim 1, further comprising:
   first connectors coupled to the plurality of second conductive features of the interconnect.

3. The device of claim 2, further comprising:
   a die attached to the first connectors; and
   an encapsulant on the second dielectric layers of the interconnect, the encapsulant surrounding the die and the first connectors.

4. The device of claim 2, further comprising:
   second connectors coupled to the UBM, the second connectors being larger than the first connectors.

5. The device of claim 4, further comprising:
   a package substrate connected to the second connectors.

6. The device of claim 4, wherein a pitch of the first connectors is smaller than a pitch of the second connectors.

7. The device of claim 1, wherein the first conductive layer comprises nickel and the second conductive layer comprises copper.

8. A device comprising:
a first dielectric layer;
an under-bump metallurgy (UBM) extending entirely through the first dielectric layer, the UBM comprising a first conductive layer being level with a first side of the UBM and a second conductive layer being level with a second side of the UBM on the first conductive layer, the first conductive layer and the second conductive layer having the same width, the UBM not extending along the first dielectric layer;
a second dielectric layer on the first dielectric layer, the second dielectric layer having a first side facing the UBM and a second side opposite the first side;
a seed layer extending through the second dielectric layer and contacting the UBM; and
a conductive material on the seed layer, the conductive material separated from the second dielectric layer by the seed layer, the conductive material separated from the second conductive layer of the UBM by the seed layer, the conductive material having a first width at the first side of the second dielectric layer and a second width at the second side of the second dielectric layer, the second width being greater than the first width.

9. The device of claim 8, wherein top surfaces of the conductive material and the second dielectric layer are level.

10. The device of claim 9, wherein bottom surfaces of the seed layer and the second dielectric layer are level.

11. The device of claim 10, further comprising:
a plurality of third dielectric layers on the second side of the second dielectric layer; and
a plurality of conductive features disposed in the third dielectric layers.

12. The device of claim 11, further comprising:
a die attached to the third dielectric layers; and
an encapsulant surrounding the die, top surfaces of the die and the encapsulant being level.

13. A device comprising:
one or more redistribution layers (RDLs), the one or more RDLs having a first side and a second side opposite the first side;
first connectors on the first side of the one or more RDLs, wherein the first connectors are formed of a first reflowable material;
a first dielectric layer on the second side of the one or more RDLs, the first dielectric layer having a first side and a second side opposite the first side;
a conductive feature extending from the first side of the first dielectric layer to the second side of the first dielectric layer, the conductive feature having a first width at the first side of the first dielectric layer and a second width at the second side of the first dielectric layer, the second width being different from the first width, the conductive feature comprising a main metal body and a seed layer extending along sides and a bottom of the main metal body;
a second dielectric layer on the first dielectric layer, the second dielectric layer having a first side and a second side opposite the first side;
an under-bump metallurgy (UBM) extending through the second dielectric layer to contact the seed layer of the conductive feature, the UBM having a first conductive layer and a second conductive layer over the first conductive layer, the first conductive layer of the UBM being level with the first side of the second dielectric layer, the second conductive layer of the UBM being level with the second side of the second dielectric layer, a width of the first conductive layer being the same as a width of the second conductive layer;
second connectors on the UBM, wherein the second connectors are larger than the first connectors, and wherein the second connectors are formed of a second reflowable material;
a die attached to the first connectors; and
an encapsulant on the first side of the one or more RDLs, wherein the encapsulant extends along sidewalls of the die, and at least a portion of the encapsulant extends between the die and the one or more RDLs.

14. The device of claim 13, wherein a topmost surface of the encapsulant is substantially coplanar with a back side of the die.

15. The device of claim 13, wherein the UBM is interposed between the second connectors and the one or more RDLs.

16. The device of claim 13, wherein a pitch of the first connectors is smaller than a pitch of the second connectors.

17. The device of claim 13, wherein the first connectors are micro-bumps.

18. The device of claim 13, wherein the second connectors are ball grid array (BGA) connectors.

19. The device of claim 13, wherein the UBM comprises a copper layer contacting the seed layer, and a nickel layer contacting the copper layer, the nickel layer and the copper layer being the same width.

20. The device of claim 1, wherein the first conductive layer is a different material than the second conductive layer.

* * * * *